United States Patent
Ye et al.

(10) Patent No.: US 7,183,795 B2
(45) Date of Patent: Feb. 27, 2007

(54) MAJORITY VOTER APPARATUS, SYSTEMS, AND METHODS

(75) Inventors: Yibin Ye, Portland, OR (US); James W. Tschanz, Portland, OR (US); Muhammad M. Khellah, Tigard, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 58 days.

(21) Appl. No.: 10/947,765

(22) Filed: Sep. 23, 2004

(65) Prior Publication Data

US 2006/0061382 A1    Mar. 23, 2006

(51) Int. Cl.
*H03K 19/23*    (2006.01)

(52) U.S. Cl. .................. 326/36; 327/215; 365/207
(58) Field of Classification Search .............. 326/11, 326/35, 36; 327/215; 365/196, 207
See application file for complete search history.

(56) References Cited

U.S. PATENT DOCUMENTS 5,838,166 A * 11/1998 Nakamura ................ 326/36
6,580,296 B1 * 6/2003 Beiu ......................... 326/121

* cited by examiner

*Primary Examiner*—Daniel D. Chang
(74) *Attorney, Agent, or Firm*—Schwegman, Lundberg, Woessner & Kluth, P.A.

(57) ABSTRACT

Apparatus and systems, as well as methods and articles, may operate to provide a majority voter indication using a sense amplifier coupled to a first plurality of bit inputs and to a second plurality of bit inputs.

27 Claims, 4 Drawing Sheets

US 7,183,795 B2

MAJORITY VOTER APPARATUS, SYSTEMS, AND METHODS

TECHNICAL FIELD

Various embodiments described herein relate to digital circuits generally, including apparatus, systems, and methods used to communicate binary data.

BACKGROUND INFORMATION

Parallel data paths including buses may be used to communicate binary information. In the course of data transfer across a bus, it may be desirable to determine whether the majority of bits on the bus are in a specified condition (e.g., set or reset "majority voter" status).

Some majority voter methods may employ a cascade of logic gates to count the number of bit inputs in a set condition from a small group of bit inputs (e.g. two-of-three counters), and to sum the output of the cascade. The number of gates required to implement this solution may increase geometrically with bus width. Analog majority voter methods may resistively couple bit inputs to an operational amplifier input, and couple a voltage source to the other operational amplifier input as a reference. Such solutions may consume significant static power, and using a reference voltage source may increase circuit complexity.

DETAILED DESCRIPTION

Various embodiments disclosed herein attempt to reduce circuit complexity and/or static power consumption in majority voter apparatus. In some embodiments, input bits participating in a "vote" may be coupled to a voltage divider network that may include branches of transistors coupled to each of two legs of a cross-coupled pair of transistors in series between a voltage source and a sense amplifier. "Voting" in the current context means determining whether a group of input bits comprises more bits set to a logical "one" or more bits set to a logical "zero," and/or providing a single-bit indication thereof.

Static current through the voltage divider may be partially avoided by employing a transistor in series between the voltage source and the cross-coupled pair of transistors, and by enabling this series transistor at a time of voting. In some embodiments, it may be useful to match the transistors in both branches, perhaps by using devices having relatively long channels.

Figure 1:
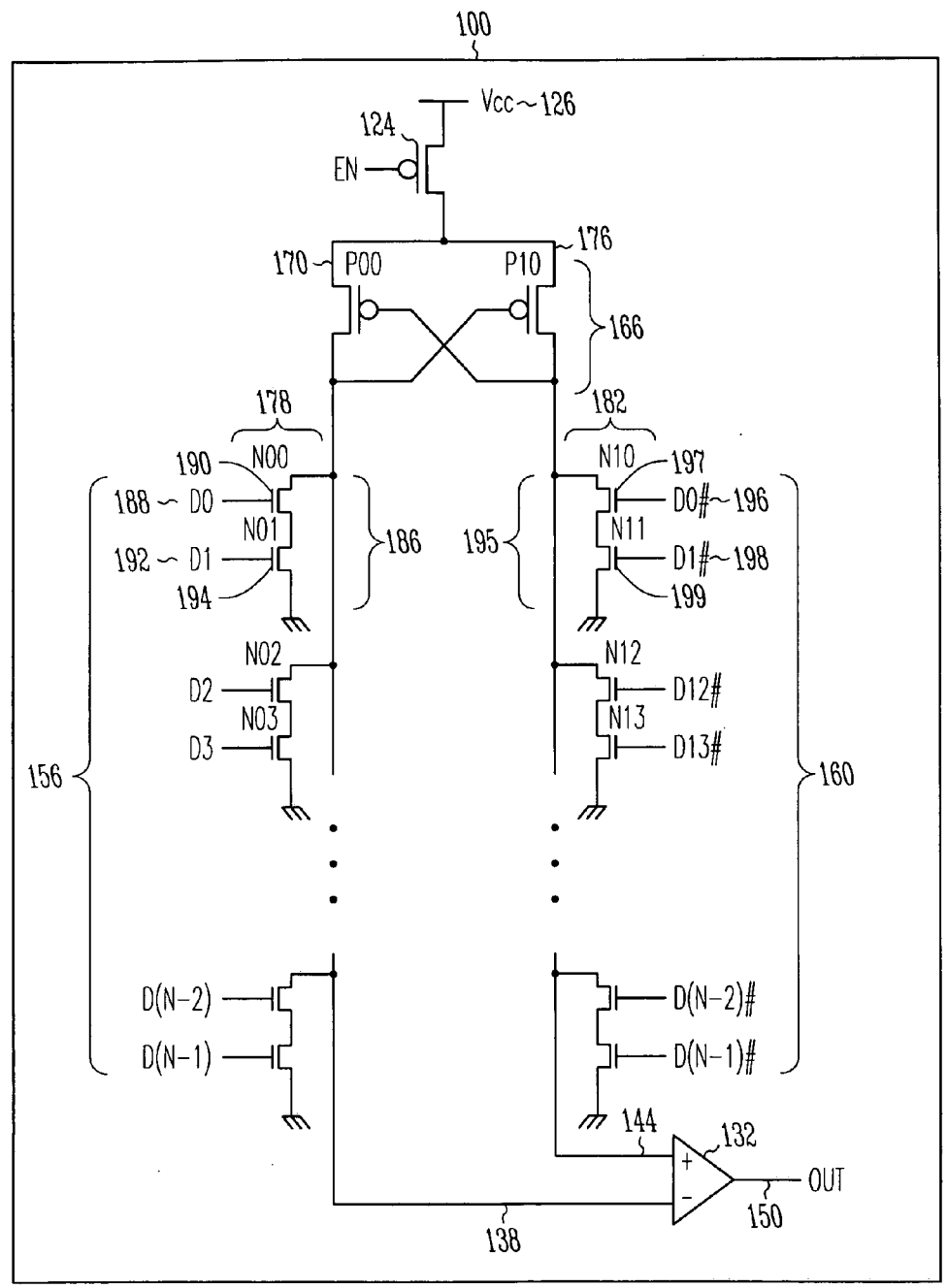
FIG. 1 comprises a diagram of an apparatus according to various embodiments of the invention.

FIG. 1 is a diagram of an apparatus 100 according to various embodiments of the invention. For example, the apparatus 100 may include a sense amplifier 132 having a first sense input 138, a second sense input 144, and/or a sense output 150 to provide a majority voter indication. In some embodiments of the apparatus 100, a first plurality of bit inputs 156 may be coupled to the first sense input 138, and/or a second plurality of bit inputs 160 may be coupled to the second sense input 144.

In some embodiments, the apparatus 100 may also include a cross-coupled pair of transistors 166, as well as a first transistor 170 coupled to the first plurality of bit inputs 156 and/or a second transistor 176 coupled to the second plurality of bit inputs 160. The apparatus 100 may also include a power enable device 124 (e.g., a transistor) coupled to the cross-coupled pair of transistors 166 and a voltage source 126. The apparatus 100 may further include a first plurality of transistors 178 coupled to the first plurality of bit inputs 156 and the first sense input 138, as well as a second plurality of transistors 182 coupled to the second plurality of bit inputs 160 and the second sense input 144.

In some embodiments, the first plurality of transistors 178 may comprise a first pair of series-connected transistors 186, wherein a first bit input 188 selected from the first plurality of bit inputs 156 may be coupled to the first sense input 138 by a first transistor 190 selected from the first pair of series-connected transistors 186. In addition, a second bit input 192 selected from the first plurality of bit inputs 156 may be coupled to the first sense input 138 by a second transistor 194 selected from the first pair of series-connected transistors 186.

In some embodiments, the second plurality of transistors 182 may comprise a second pair of series-connected transistors 195, wherein a first bit input 196 selected from a second plurality of bit inputs 160 may be coupled to a second sense input 144 by a first transistor 197 selected from the second pair of series-connected transistors 195. In some embodiments, a second bit input 198 selected from the second plurality of bit inputs 160 may be coupled to the second sense input 144 by a second transistor 199 selected from the second pair of series-connected transistors 195.

Figure 2:
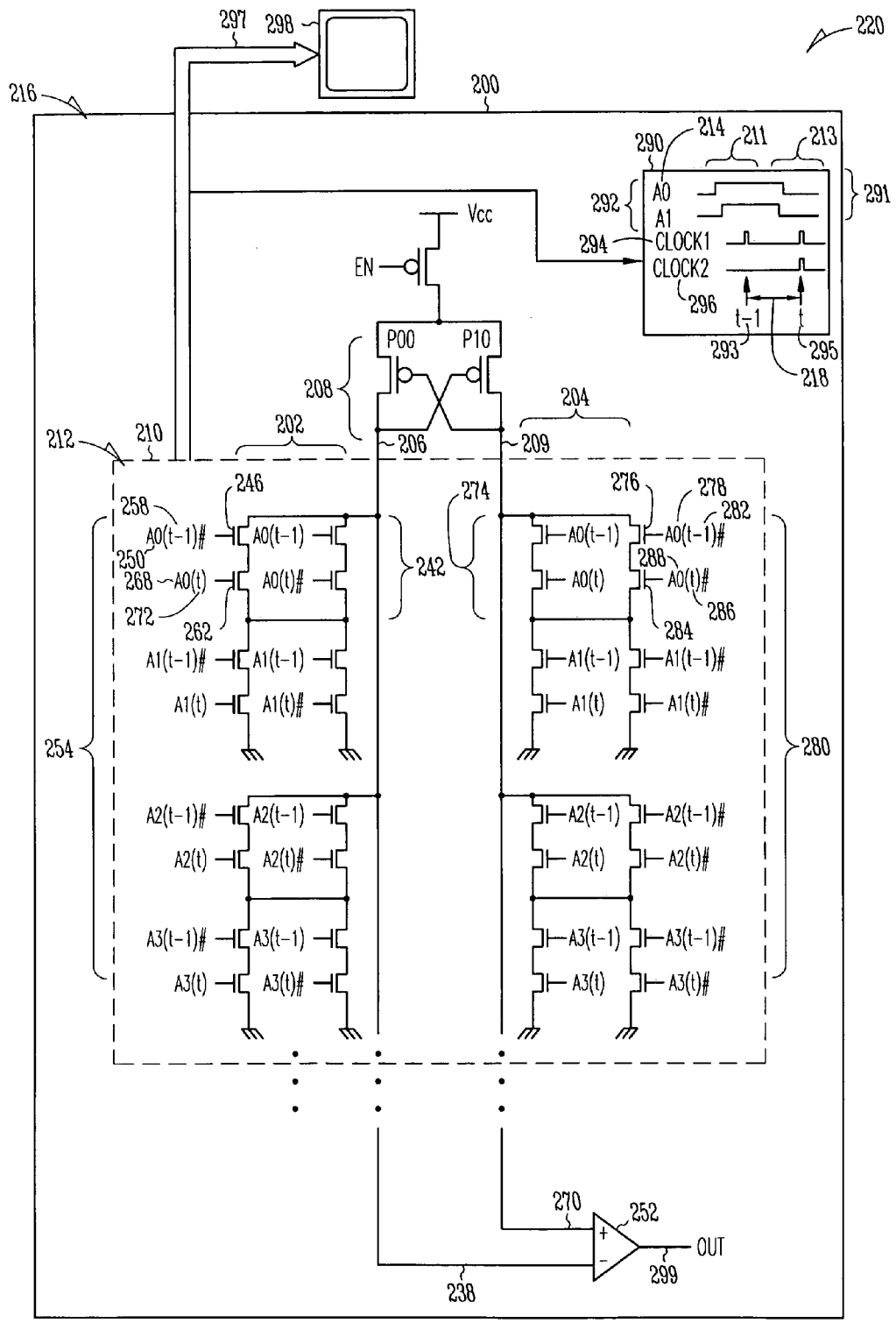
FIG. 2 comprises a diagram of an apparatus and a system according to various embodiments of the invention.

FIG. 2 is a diagram of an apparatus 200 and a system 220 according to various embodiments of the invention. The apparatus 200 may, for example, include a first sense input 238 coupled to a first pair of series-connected transistors 242, wherein a first transistor 246 selected from the first pair of series-connected transistors 242 may be coupled to a first bit input 250 selected from a first plurality of bit inputs 254 according to a first state associated with a first transition time (t-1) 258. The apparatus 200 may also include a second transistor 262 selected from the first pair of series-connected transistors 242, coupled to a second bit input 268 selected from the first plurality of bit inputs 254 according to a second state associated with a second transition time (t) 272.

In some embodiments, the apparatus 200 may include a second sense input 270 coupled to a second pair of series-connected transistors 274, wherein a first transistor 276 selected from the second pair of series-connected transistors 274 may be coupled to a first bit input 278 selected from a second plurality of bit inputs 280 according to a first state associated with a first transition time (t-1) 282. The apparatus 200 may also include a second transistor 284 selected from the second pair of series-connected transistors 274, coupled to a second bit input 286 selected from the second plurality of bit inputs 280 according to a second state associated with a second transition time (t) 288.

In some embodiments, the apparatus 200 may include a transition state module 290 to sense a first plurality of states 211 associated with a plurality of bits 292 received at the first plurality of bit inputs 254, and/or a second plurality of states 213 associated with the plurality of bits 292. The apparatus 200 may recognize a state transition of a bit 214 selected from the plurality of bits 292 by a state change of the bit 214 during a period 218 between approximately a first time (t-1) and a second time (t). The transition state module 290 used in some embodiments of the apparatus 200 may be capable of sensing the first plurality of states 211 at a first time (t-1) 293 substantially synchronous with a first portion of a first clock signal 294, and/or to sense the second plurality of states 213 at a second time (t) 295 substantially synchronous with a second portion of the first clock signal 294. In some embodiments, the transition state module 290 may also be capable of sensing the first plurality of states 211 at a first time (t-1) 293 substantially synchronous with a first clock signal 294, and/or to sense the second plurality of states 213 at a second time (t) 295 substantially synchronous with a second clock signal 296. Other embodiments may also be realized.

For example, a system 220 may include an apparatus, similar to or identical to the apparatus 100 and 200 previously described, as well as a bus 297 and possibly, a display 298 to couple to the bus 297. In some embodiments, the system 220 may also include one or more majority voter modules 216 coupled to the bus 297 to provide a majority voter indication according to a sensed output 299 of a sense amplifier 252 having a first sense input 238 coupled to a first plurality of bit inputs 254, and/or a second sense input 270 coupled to a second plurality of bit inputs 280.

In some embodiments, the majority voter module 216 may include a voltage divider network 210, divided into a first branch 202 and a second branch 204. The first branch 202 of the voltage divider network 210 may be coupled to a first output 206 of a cross-coupled pair of transistors 208. The second branch 204 may be coupled to a second output 209 of the cross-coupled pair of transistors 208. The voltage divider network 210 of the system 220 may comprises a plurality of transistors 212.

In some embodiments, the system 220 may also include a transition state module 290 to sense a plurality of transitions 291 associated with a plurality of bits 292 to determine a sensed output 299. As noted previously with respect to the apparatus 200, the transition state module of the system 220 may sense the plurality of transitions 291 at a time substantially synchronous with a time of occurrence of a first clock signal 294 to be carried by the bus 297.

The apparatus 100, 200, system 220, sense amplifier 132, sense inputs 138, 144, 238, 270, sense outputs 150, 199, bit inputs 156, 160, 188, 192, 196, 198, 250, 268, 278, 286, cross-coupled pairs of transistors 166, 208, transistors 170, 176, 190, 194, 197, 199, 246, 262, 276, 284, power enable transistor 124, voltage source 126, first plurality of transistors 178, second plurality of transistors 182, pairs of series-connected transistors 186, 195, 242, 274, first plurality of bit inputs 254, first transition times (t-1) 258, 282, second transition times (t) 272, 288, second plurality of bit inputs 280, transition state module 290, first plurality of transitions 211, second plurality of transitions 213, plurality of transitions 291, first plurality of bit inputs 292, bit 214, period 218, first time (t-1) 293, clock signals 294, 296, second time (t) 295, bus 297, display 298, majority voter module 216, voltage divider network 210, first branch 202, second branch 204, first output 206, second output 209, and plurality of transistors 212 may all be characterized as "modules" herein.

Such modules may include hardware circuitry, and/or a processor and/or memory circuits, software program modules and objects, and/or firmware, and combinations thereof, as desired by the architect of the apparatus 100, 200 and system 220, and as appropriate for particular implementations of various embodiments. For example, such modules may be included in a system operation simulation package, such as a software electrical signal simulation package, a power usage and distribution simulation package, a capacitance-inductance simulation package, a power/heat dissipation simulation package, a signal transmission-reception simulation package, and/or a combination of software and hardware used to simulate the operation of various potential embodiments.

It should also be understood that the apparatus and systems of various embodiments can be used in applications other than majority voter and bus implementations, and thus various embodiments are not to be so limited. The illustrations of apparatus 100, apparatus 200, and system 220 are intended to provide a general understanding of the structure of various embodiments, and they are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, processor modules, embedded processors, data switches, and application-specific modules, including multilayer, multi-chip modules. Such apparatus and systems may further be included as sub-components within a variety of electronic systems, such as televisions, cellular telephones, personal computers, workstations, radios, video players, vehicles, and others. Some embodiments may include a number of methods.

Figure 3:
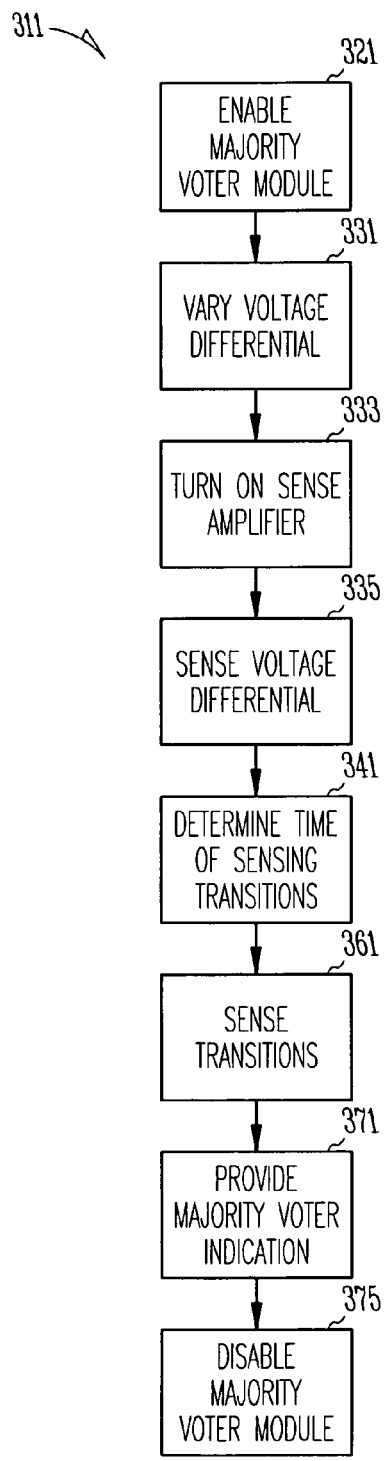
FIG. 3 comprises a flow diagram illustrating several methods according to various embodiments of the invention.

For example, FIG. 3 is a flow diagram illustrating several methods 311 according to various embodiments of the invention. Thus, a method 311 may (optionally) begin at block 321 with enabling a majority voter module at a first time prior to a second time of turning on a sense amplifier. The method 311 may continue with varying a voltage differential according to a state of a bit selected from a group of bits at block 331. The method 311 may include turning on the sense amplifier to provide a majority voter indication at block 333. It should be noted that in some embodiments, the majority voter indication may be provided by using the sense amplifier in conjunction with (e.g., coupled to) a cross-coupled pair of transistors. At block 335, the method 311 may include sensing the voltage differential at the sense amplifier, wherein the sense amplifier may be to couple to a first branch of a first voltage divider network to receive a first plurality of bits included in a group of bits, and to couple to a second branch of a second voltage divider network to receive a second plurality of bits included in the group of bits.

The method 311 may also include determining a time of sensing a plurality of transitions according to a time of occurrence of a clock signal at block 341, sensing the plurality of transitions associated with a group of bits to determine a majority voter indication at block 361, and/or providing the majority voter indication at block 371. The method 311 may (optionally) conclude by disabling a majority voter module at a third time after a fourth time of turning off a sense amplifier at block 375.

It should be noted that the methods described herein do not have to be executed in the order described, or in any particular order. Moreover, various activities described with respect to the methods identified herein can be executed in repetitive, serial, or parallel fashion. Information, including parameters, commands, operands, and other data, can be sent and received in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. The programs may be structured in an object-orientated format using an object-oriented language such as Java or C++. Alternatively, the programs can be structured in a procedure-orientated format using a procedural language, such as assembly or C. The software components may communicate using any of a number of mechanisms well known to those skilled in the art, such as application program interfaces or interprocess communication techniques, including remote procedure calls. The teachings of various embodiments are not limited to any particular programming language or environment. Thus, other embodiments may be realized.

Figure 4:
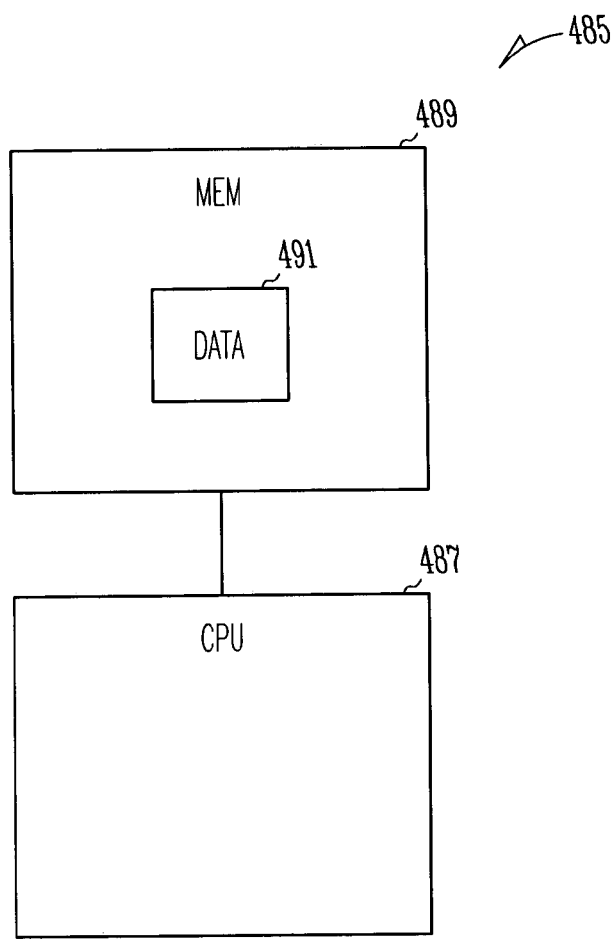
FIG. 4 comprises a block diagram of an article according to various embodiments of the invention.

For example, FIG. 4 is a block diagram of an article 485 according to various embodiments of the invention. Examples of such embodiments may comprise a computer, a memory system, a magnetic or optical disk, some other storage device, and/or any type of electronic device or system. The article 485 may include a processor 487 coupled to a machine-accessible medium such as a memory 489 (e.g., a memory including an electrical, optical, or electromagnetic conductor) having associated information 491 (e.g., computer program instructions and/or data), which, when accessed, results in a machine (e.g., the processor 487) performing such actions as sensing a voltage differential at a sense amplifier. As noted previously, the sense amplifier may be to couple to a first branch of a first voltage divider network coupled to a first plurality of bits included in a group of bits, and/or to a second branch of a second voltage divider network coupled to a second plurality of bits included in the group of bits.

Other activities may include, for example, providing a majority voter indication. Further activities may include providing the majority voter indication using the sense amplifier coupled to a cross-coupled pair of transistors. Other activities may include sensing a plurality of transitions associated with a group of bits to determine the majority voter indication, and/or determining a time of sensing the plurality of transitions according to a time of occurrence of a clock signal.

Implementing the apparatus, systems, and/or methods disclosed herein may decrease majority voter apparatus circuit complexity. Power requirements may also be reduced.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus, including:
   a sense amplifier having a first sense input, a second sense input, and a sense output to provide a majority voter indication;
   a first plurality of bit inputs coupled to the first sense input;
   a second plurality of bit inputs coupled to the second sense input;
   a cross-coupled pair of transistors including a first transistor coupled to the first plurality of bit inputs and a second transistor coupled to the second plurality of bit inputs; and
   a power enable device coupled to the cross-coupled pair of transistors and to a voltage source.

2. The apparatus of claim 1, further comprising:
   a first plurality of transistors coupled to the first plurality of bit inputs and to the first sense input; and
   a second plurality of transistors coupled to the second plurality of bit inputs and to the second sense input.

3. The apparatus of claim 2, wherein the first plurality of transistors comprises a first pair of series-connected transistors, wherein a first bit input selected from the first plurality of bit inputs is coupled to the first sense input by a first transistor selected from the first pair of series-connected transistors, and wherein a second bit input selected from the first plurality of bit inputs is coupled to the first sense input by a second transistor selected from the first pair of series-connected transistors.

4. The apparatus of claim 3, wherein the second plurality of transistors comprises a second pair of series-connected transistors, wherein a first bit input selected from the second plurality of bit inputs is coupled to the second sense input by a first transistor selected from the second pair of series-connected transistors, and wherein a second bit input selected from the second plurality of bit inputs is coupled to the second sense input by a second transistor selected from the second pair of series-connected transistors.

5. The apparatus of claim 1, wherein the first sense input is coupled to a first pair of series-connected transistors, wherein a first transistor selected from the first pair of series-connected transistors is coupled to a first bit input selected from the first plurality of bit inputs according to a first state associated with a first transition time, and wherein a second transistor selected from the first pair of series-connected transistors is coupled to a second bit input selected from the first plurality of bit inputs according to a second state associated with a second transition time.

6. The apparatus of claim 1, wherein the second sense input is coupled to a second pair of series-connected transistors, wherein a first transistor selected from the second pair of series-connected transistors is coupled to a first bit input selected from the second plurality of bit inputs according to a first state associated with a first transition time, and wherein a second transistor selected from the second pair of series-connected transistors is coupled to a second bit input selected from the second plurality of bit inputs according to a second state associated with a second transition time.

7. The apparatus of claim 1, further including:
a transition state module to sense a first plurality of states associated with a plurality of bits received at the first plurality of bit inputs, and a second plurality of states associated with the plurality of bits.

8. The apparatus of claim 7, wherein a state transition of a bit selected from the plurality of bits comprises a state change of the bit during a period between approximately a first time and a second time.

9. The apparatus of claim 7, wherein the transition state module is to sense the first plurality of states at a first time substantially synchronous with a first portion of a first clock signal, and to sense the second plurality of states at a second time substantially synchronous with a second portion of the first clock signal.

10. The apparatus of claim 7, wherein the transition state module is to sense the first plurality of states at a first time substantially synchronous with a first clock signal, and to sense the second plurality of states at a second time substantially synchronous with a second clock signal.

11. A system, including:
a sense amplifier having a first sense input, a second sense input, and a sense output to provide a majority voter indication;
a first plurality of bit inputs coupled to the first sense input;
a second plurality of bit inputs coupled to the second sense input;
a cross-coupled pair of transistors including a first transistor coupled to the first plurality of bit inputs and a second transistor coupled to the second plurality of bit inputs;
a power enable device coupled to the cross-coupled pair of transistors and to a voltage source;
a bus coupled to at least one of the first plurality of bit inputs or the second plurality of bit inputs; and
a display coupled to the bus.

12. The system of claim 11, wherein at least one of the first plurality of bit inputs or the second plurality of bit inputs comprises a voltage divider network.

13. The system of claim 12, wherein the voltage divider network is divided into a first branch and a second branch, wherein the first branch is coupled to a first output of the cross-coupled pair of transistors, and wherein the second branch is coupled to a second output of the cross-coupled pair of transistors.

14. The system of claim 12, wherein the voltage divider network comprises a plurality of transistors.

15. The system of claim 11, further including:
a transition state module to sense a plurality of transitions associated with at least one of the first plurality of bits or the second plurality of bits to determine the sensed output.

16. The system of claim 15, wherein the transition state module is adapted to sense the plurality of transitions at a time substantially synchronous with a time of occurrence of a clock signal to be carried by the bus.

17. A method, including:
sensing a voltage differential at a sense amplifier wherein the sense amplifier is coupled to a first branch of a first voltage divider network to receive a first plurality of bits included in a group of bits, and to a second branch of a second voltage divider network to receive a second plurality of bits included in the group of bits, wherein a cross-coupled pair of transistors is coupled to the sense amplifier, including a first transistor coupled to the first plurality of bits and a second transistor coupled to the second plurality of bits; and wherein a power enable device is coupled to the cross-coupled pair of transistors and to a voltage source.

18. The method of claim 17, further including:
providing a majority voter indication.

19. The method of claim 18, further including:
turning on the sense amplifier to provide the majority voter indication.

20. The method of claim 18, further including:
sensing a plurality of transitions associated with the group of bits to determine the majority voter indication.

21. The method of claim 20, further including:
determining a time of sensing the plurality of transitions according to a time of occurrence of a clock signal.

22. The method of claim 17, further including:
varying the voltage differential according to a state of a bit selected from the group of bits.

23. The method of claim 17, further including:
enabling a majority voter module at a first time prior to a second time of turning on the sense amplifier; and
disabling the majority voter module at a third time after a fourth time of turning off the sense amplifier.

24. A computer readable medium having instructions stored thereon which, when executed by a processor, cause the processor to perform activities including
sensing a voltage differential at a sense amplifier to provide a majority voter indication, wherein the sense amplifier is to couple to a first branch of a first voltage divider network coupled to a first plurality of bits included in a group of bits, and to a second branch of a second voltage divider network coupled to a second plurality of bits included in the group of bits, wherein a cross-coupled pair of transistors is coupled to the sense amplifier, including a first transistor coupled to the first plurality of bits and a second transistor coupled to the second plurality of bits; and wherein a power enable device is coupled to the cross-coupled pair of transistors and to a voltage source.

25. The computer readable medium of claim 24, wherein an output of the sense amplifier comprises the majority voter indication.

26. The computer readable medium of claim 25, wherein the instructions, when executed by the processor, cause the processor to perform activities including:
providing the majority voter indication using the sense amplifier coupled to a cross-coupled pair of transistors.

27. The computer readable medium of claim 25, wherein the instructions, when executed by the processor, cause the processor to perform activities including:
sensing a plurality of transitions associated with the group of bits to determine the majority voter indication; and
determining a time of sensing the plurality of transitions according to a time of occurrence of a clock signal.

* * * * *